United States Patent
Okuyama

(10) Patent No.: US 6,995,832 B2
(45) Date of Patent: Feb. 7, 2006

(54) APPARATUS FOR FORMING PATTERN

(75) Inventor: Takashi Okuyama, Saitama (JP)

(73) Assignee: PENTAX Corporation, Tokyo (JP)

( * ) Notice: Subject to any disclaimer, the term of this patent is extended or adjusted under 35 U.S.C. 154(b) by 91 days.

(21) Appl. No.: 10/834,236

(22) Filed: Apr. 29, 2004

(65) Prior Publication Data
US 2004/0223128 A1  Nov. 11, 2004

(30) Foreign Application Priority Data
May 8, 2003 (JP) ............................. P2003-129893

(51) Int. Cl.
G03B 27/54 (2006.01)
B41J 2/47 (2006.01)
B41J 27/435 (2006.01)

(52) U.S. Cl. .................. 355/67; 347/225; 347/247; 347/249

(58) Field of Classification Search .................. 355/53, 355/67, 68; 347/225, 229, 230, 241, 247, 347/248, 249
See application file for complete search history.

(56) References Cited

U.S. PATENT DOCUMENTS

| 5,241,330 | A | | 8/1993 | Kawabata et al. |
| 5,247,373 | A | | 9/1993 | Iwama et al. |
| 5,436,728 | A | | 7/1995 | Watanabe |
| 6,011,256 | A | * | 1/2000 | Takada ....................... 250/235 |
| 6,686,948 | B2 | * | 2/2004 | Takeuchi .................... 347/244 |

FOREIGN PATENT DOCUMENTS

JP     2549011     8/1996

* cited by examiner

Primary Examiner—Alan Mathews
(74) Attorney, Agent, or Firm—Greenblum & Bernstein, P.L.C.

(57) ABSTRACT

An apparatus for forming a pattern has a beam position detector, a fine-section scale corrector, a pulse data selector, and a control pulse signal generator. The beam position detector measures a position of the beam on a scanning-line. The fine-section scale corrector changes a scale of a series of fine-sections to a series of corrected fine-sections, in accordance with a scale-change rate, to change a scale of the pattern. The pulse data selector selects a set of pulse data, corresponding to a length of the corrected fine section that the beam passes, from a series of sets of pulse data. The control pulse signal generator successively generates a sequence of control pulse signals in accordance with the selected set of pulse data.

8 Claims, 9 Drawing Sheets

FIG. 7

| PULSE DIFFERENCE NUMBER (KO) | ADDRESS | STANDARD PULSE NUMBER (TP) | ADDRESS | CORRECTED PULSE NUMBER (TP') |
|---|---|---|---|---|
| 200 | | 200 | | 150 |
| 201 | | 401 | | 300 |
| 202 | | 603 | | 451 |
| | | ------ | | |

93

APPARATUS FOR FORMING PATTERN

BACKGROUND OF THE INVENTION

1. Field of the Invention

The present invention relates to a beam writer that forms a circuit pattern on a substrate such as a film board and a glass board, or that forms an image on a sheet for recording. Especially, it relates to controlling beam-modulation.

2. Description of the Related Art

A laser writer forms an electric circuit pattern on a substrate, such as a silicon wafer, and so on. While, a laser scanner forms an image on a paper. The above beam writer has, for example, an exposure optical system with a polygon mirror and an f–θ lens, and scans an electronic beam or laser beam on a photo-receiving material by using the exposure optical system. Then, an optical-modulator incorporated in the exposure optical system, such as an AOM (Acousto-Optical Modulator), modulates the beam. Namely, the optical modulator controls the exposure on the photo-receiving material by passing and intercepting the beam in accordance with pattern-data. The beam modulation is controlled by a sequence of high frequency control pulse signals.

The scanning-speed of the beam is not always constant due to the precision of the f–θ lens and the polygon mirror. Differing precision results in an irregular scanning-speed. To correct the irregular scanning-speed, the frequency of the control pulse signals for modulating the beam is modified in accordance with the variation of the scanning-speed. For example, a scanning line is divided into constant distance-intervals, and a time-interval, which is a pass-time of the beam in each distance-interval, is successively measured along the scanning-line before forming the pattern. Then, when scanning the beam, the clock frequency is adjusted in accordance with the detected series of time-intervals. In order to minimize a dot-pitch of the pattern, as much as possible, a PLL (Phase-Locked Loop) circuit is utilized to generate clock pulses with an accurate frequency.

SUMMARY OF THE INVENTION

An object of the present invention is to provide an apparatus that adequately and effectively forms a pattern while changing the scale of the pattern.

An apparatus for forming a pattern has a light source, a scanning unit, a beam position detector, a fine-section scale corrector, a pulse-data selector, a control-pulse signal generator, a writing-pulse signal generator, and an optical modulator. The light source emits a beam, and the scanning unit scans the beam on a photosensitive material. The beam position detector measures a position of the beam on a scanning-line. The fine-section scale corrector changes the scale of a series of fine-sections to a series of corrected fine-sections in accordance with a scale-change rate to change a scale of the pattern. For example, the scale-change rate is changed by a user. The series of fine sections is defined by dividing a scanning-line at constant-intervals, and the length of each fine section is changed in accordance with the scale-change rate. The pulse data selector selects a set of pulse data, corresponding to a length of the corrected fine section that the beam passes, from a series of sets of pulse data. The series of sets of pulse data has a different data-array in accordance with the length of the corrected fine section. The control pulse signal generator successively generates a sequence of control pulse signals in accordance with the selected set of pulse data. The writing pulse signal generator successively generates a sequence of writing pulse signals in accordance with the sequence of control pulse signals. The sequence of control pulse signals controls the output-timing of the sequence of writing pulse signals. The optical modulator modulates the beam in accordance with the sequence of writing pulse signals.

BRIEF DESCRIPTION OF THE DRAWINGS

The present invention will be better understood from the description of the preferred embodiment of the invention set fourth below together with the accompanying drawings, in which:

FIG. 7 is a view showing the trigger position data;

DESCRIPTION OF THE PREFERRED EMBODIMENTS

Hereinafter, the preferred embodiment of the present invention is described with reference to the attached drawings.

Figure 1:
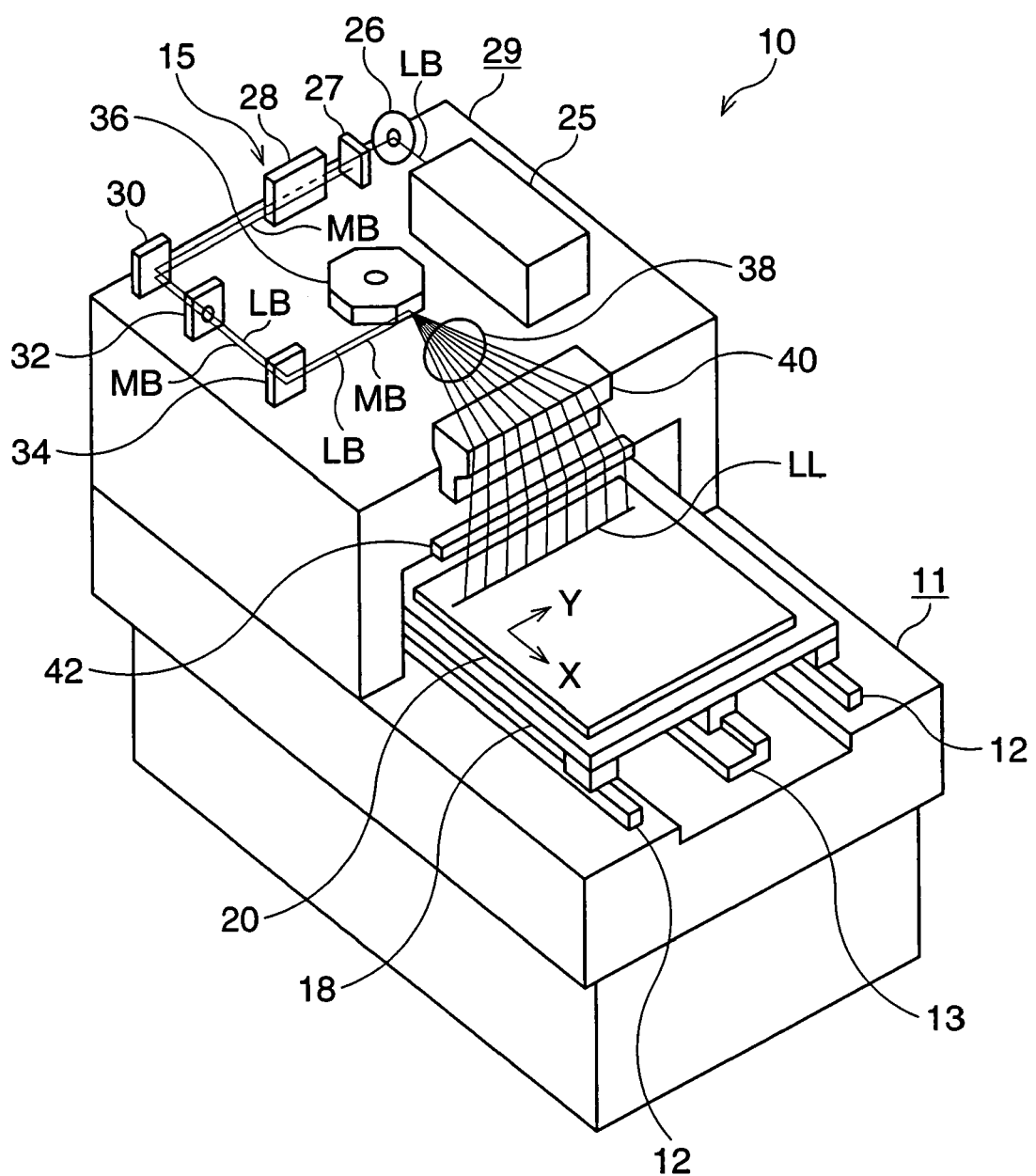
FIG. 1 is a schematic view of a laser writer according to an embodiment of the invention.

FIG. 1 is a schematic view of a laser writer according to an embodiment of the invention.

The laser writer 10 scans a laser beam on a substrate 20, such as a glass board or a film for a PWB (Printed Wiring Board, so as to form a circuit-pattern on the substrate 20. The laser writer 10 includes a base 11, a fixed table 29, and a writing table 18. The fixed table 29 and the writing table 18 are arranged on the base 11. A semiconductor laser 25 and an exposure optical system 15 that transmits a beam from the semiconductor laser 25 toward the writing table 18, are mounted on the fixed table 29.

Two rails 12 are arranged on the base 10 and are parallel to each other. A table driving mechanism 13 drives the writing table 18 so that the writing table 18 moves along the pair of rails 12. The substrate 20 with a photo-resist layer is located on the writing table 18 when scanning the beam and writing the circuit-pattern. Hereinafter, a direction perpendicular to the moving direction of the writing table 18 is represented as a "main-scanning direction (Y-direction)", and a direction parallel to the moving direction is represented as a "sub-scanning direction (X-direction)".

A first beam bender 26 deflects a laser beam LB, which is emitted from the semiconductor laser 25, to a beam splitter 27 and an AOM (Acousto-Optical Modulator) 28. The AOM modulates the laser beam LB by transmitting and intercepting the beam LB in accordance with the pattern-data. The laser beam LB passing through the AOM 28 is directed to a polygon mirror 36 via a second beam bender 30, lens 32, and a third beam bender 34.

A polygon mirror 36 having a polyhedron composed of mirrors deflects the leaser beam LB to an f–θ lens 38 so as to scan the beam LB along the main-scanning direction (Y-direction). The laser beam LB passing through the f–θ lens 38 is directed to the writing table 18 via a turning mirror 40, and a condenser lens 42, so that the laser beam LB is irradiated on the writing table 18.

While the semiconductor laser 25 emits the laser beam LB, the polygon mirror 28 revolves at constant speed, and each mirror of the polygon mirror 28 scans the beam LB along a total of a scanning-line LL. The AOM 28 is turned ON, which interrupts the beam LB or turned OFF, which passes the beam LB, in accordance with the pattern-data. The AOM 28 is controlled in accordance with the position of the scanning-beam LB. The writing table 18 moves along the sub-scanning direction (X-direction), so that the polygon mirror 18 scans the beam LB along each scanning line in order, while the writing table 18 moves. Consequently, a circuit-pattern is formed on the total surface of the substrate 20.

The beam splitter 27 splits the beam 25 emitted from the semiconductor laser 25 into two beams, one beam LB being used for scanning, the other beam MB (hereinafter, called a "monitor beam") being used for measuring the beam-position on the substrate 20. The two beams LB and MB, parallel to each other, are directed to the polygon mirror 36, and the monitor beam MB is directed to a standard scale (herein not shown) by a mirror (not shown), which is provided between the turning mirror 40 and the condenser lens 42. The monitor beam MB is used before writing a pattern.

Figure 2:
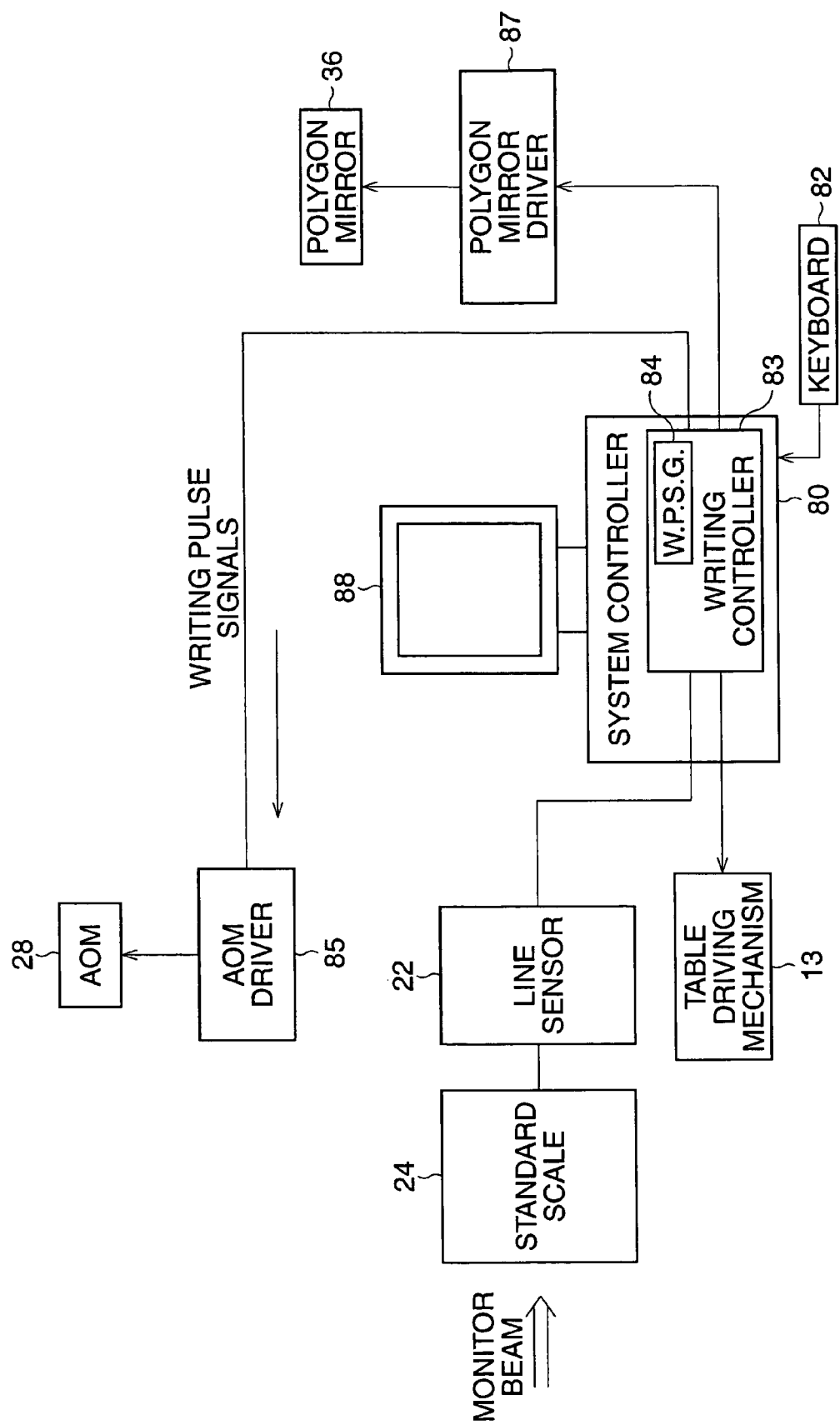
FIG. 2 is a block diagram of the laser writer.

FIG. 2 is a block diagram of the laser writer 10.

A system controller 80 controls the laser writer 10, and has a writing controller 83 and a monitor 88. A keyboard 82 is connected to the system controller 80. The writing controller 83 with a writing pulse signal generator 84 outputs control signals to the table driving mechanism 13, the AOM driver 85, and a polygon mirror driver 87. The polygon mirror driver 87 revolves the polygon mirror 36 at a constant speed, and the table driving mechanism 13 shifts the writing table 18 at a constant-speed. The AOM driver 85 outputs control signals that turn the AOM 28 ON/OFF.

A line sensor 22 is provided at the rear of the standard scale 24, and extends along the standard scale 24. To measure the scanning-speed, the line sensor is used before pattering begins. The line sensor 22 periodically detects the monitor beam MB passing through the standard scale 24, and outputs a detecting signal indicating the position of the monitor beam MB to the writing controller 83 in the system controller 80. The system controller 80 outputs driving signals to the table driving mechanism 13 in accordance with the detecting signal output from the line sensor 22, so as to shift the table driving mechanism 13 at a given speed corresponding to one line worth of scanning-time. The writing pulse signal generator 84 outputs a sequence of writing pulse signals to the AOM driver 85, which then outputs signals that turn the AOM 28 ON/OFF.

In this embodiment, the scale of the pattern formed on the substrate 20 is changed along the main-scanning direction (Y direction) so as to be scaled-down. When changing the scale of the pattern, the user operates the keyboard 82. The system controller 80 detects an operation signal from the keyboard 82, then, as described later, the sequence of writing pulse signals are generated on the basis of a determined scale-down rate.

Figure 3:
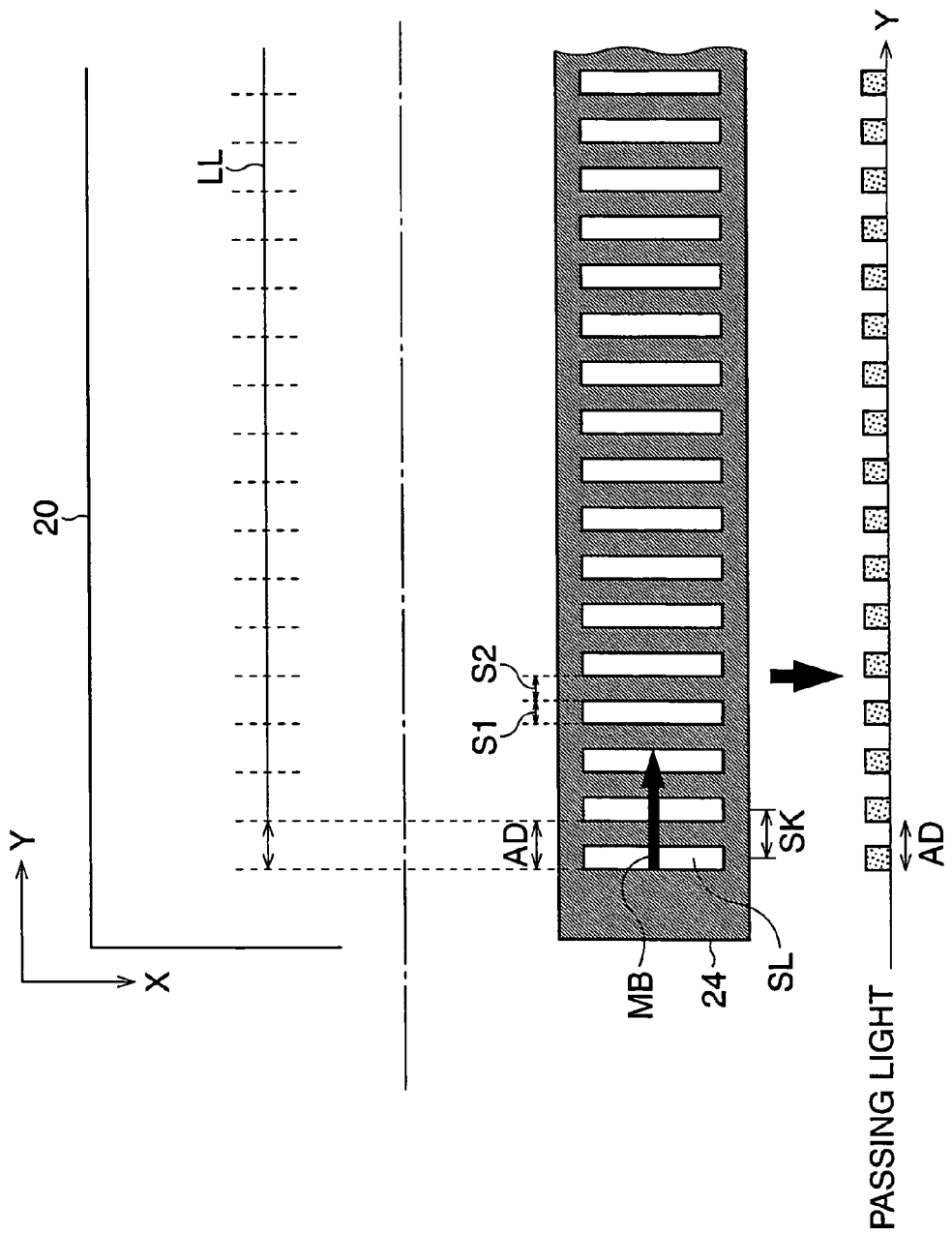
FIG. 3 is a view showing a standard scale.

FIG. 3 is a view showing the standard scale 24.

A plurality of slits "SL" is regularly and precisely formed on the standard scale 24 so that each interval between a slit and an adjacent slit is constant. The scanning-line "LL" is divided into a plurality of fine sections (intervals). The length of each fine section "AD" corresponds to a sum of the width of the slit "S1", which transmits the monitor beam MB toward the line sensor 22, and the width of the interrupting portion "S2", which interrupts the monitor beam MB. To precisely form the slits "SL" on the standard scale 24, the fine section "AD" is longer than a dot-pitch (dot-interval) of the pattern to be formed on the substrate 20. Since the width of the slit "S1" is the same as the width of the interrupting portion "S2", one fine section "AD" corresponds to a slit-pitch "SK". For example, one fine section "AD" is defined to 1 $\mu$m (1×10$^{-6}$ m).

While scanning the monitor beam MB on the standard scale 24, the pass and interruption of the monitor beam MB is repeated alternately. Consequently, a sequence of pulse signals (hereinafter, called "a series of scale signals") is output from the line sensor 22 to the writing controller 83. The position of the laser beam LB corresponds to the position of the monitor beam MB.

Figure 4:
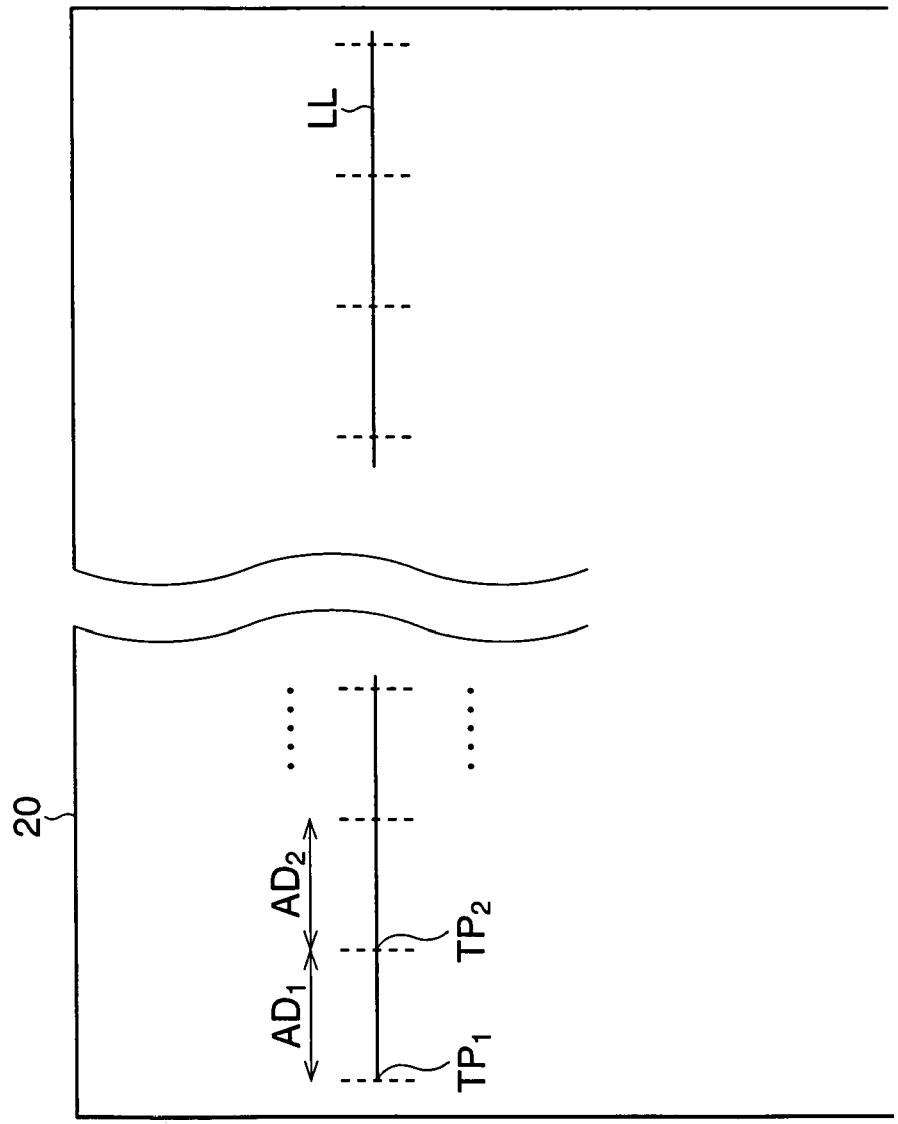
FIG. 4 is a view showing a part of the substrate.
Figure 5:
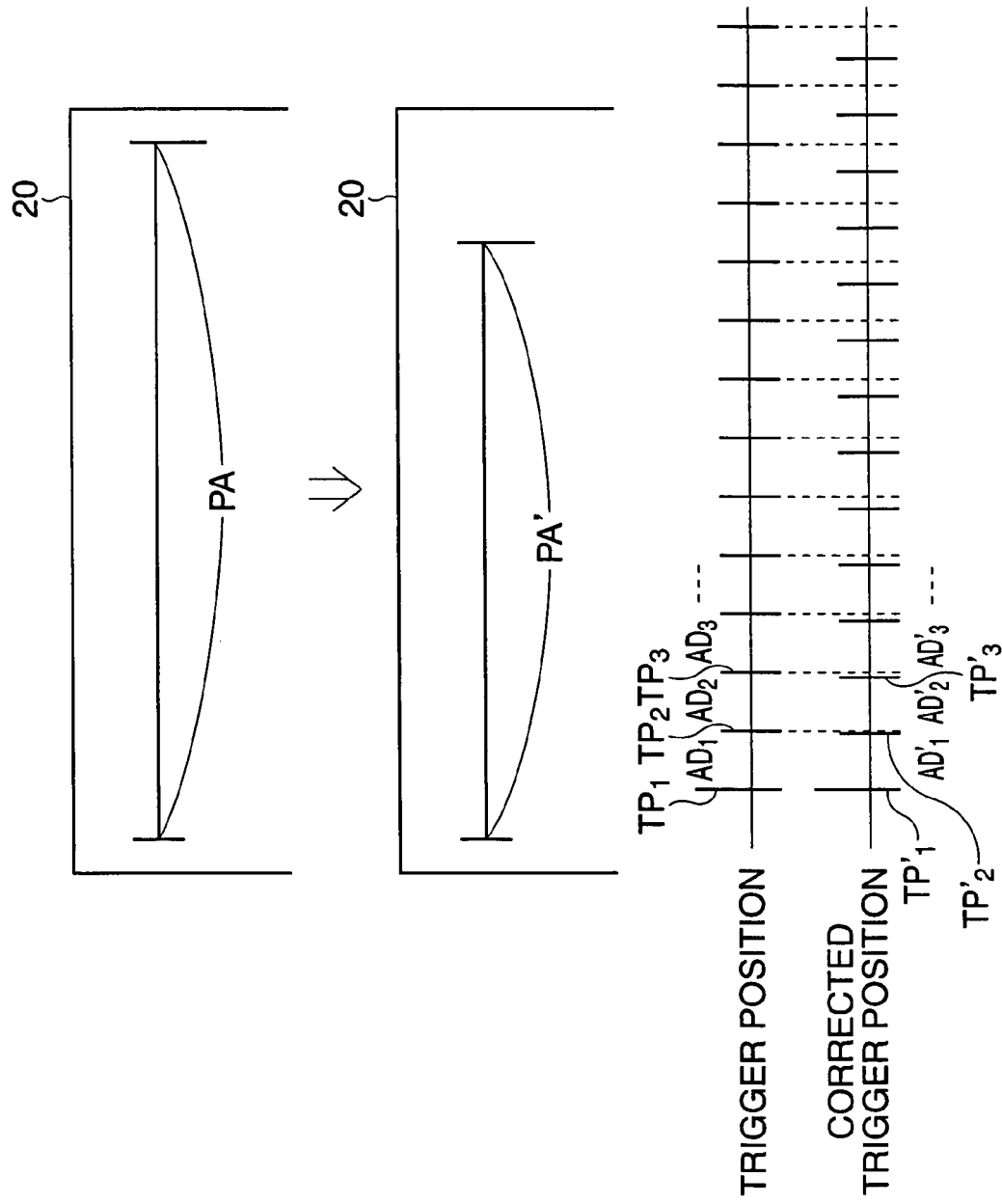
FIG. 5 is a view showing a scale-down of the pattern area.

FIG. 4 is a view showing a part of the substrate 20, and FIG. 5 is a view showing a scaled-down pattern area.

As described above, the scanning-line LL is divided into the series of fine sections "AD". The system controller 80 shown in FIG. 2 controls the output-timing of the sequence of writing pulse signals fed from the writing controller 83 in each fine section. A sequence of control pulse signals that controls the output-timing of the sequence of writing pulse signals, is generated for each fine section, as described later. The series of fine sections is hereinafter designated as "$AD_j$" (j=1, 2, . . . ). A writing start point in each fine section is preset as a "trigger position", and the sequence of control pulse signals is successively generated every time the laser beam LB passes each trigger position. Each trigger position in each fine section is designated as "$TP_j$" (j=1, 2, . . . ). The length of a fine section is of the micrometer-order.

As shown in FIG. 5, when scaling a pattern "PA" down along the main-scanning direction (Y direction) so as to form a pattern "PA'", the length of each fine section "$AD_j$" varies in accordance with the scale-down rate "N" (=PA'/PA), and the position of each trigger position is changed. The series of fine sections "$AD_j$" is changed to a series of corrected fine sections "$AD'_j$", and the series of trigger positions "$TP_j$" is changed to a series of corrected trigger positions "$TP'_j$". The sequence of control pulse signals is successively generated for each fine section, while successively measuring when the laser beam LB passes each corrected trigger position "$TP'_j$".

Figure 6:
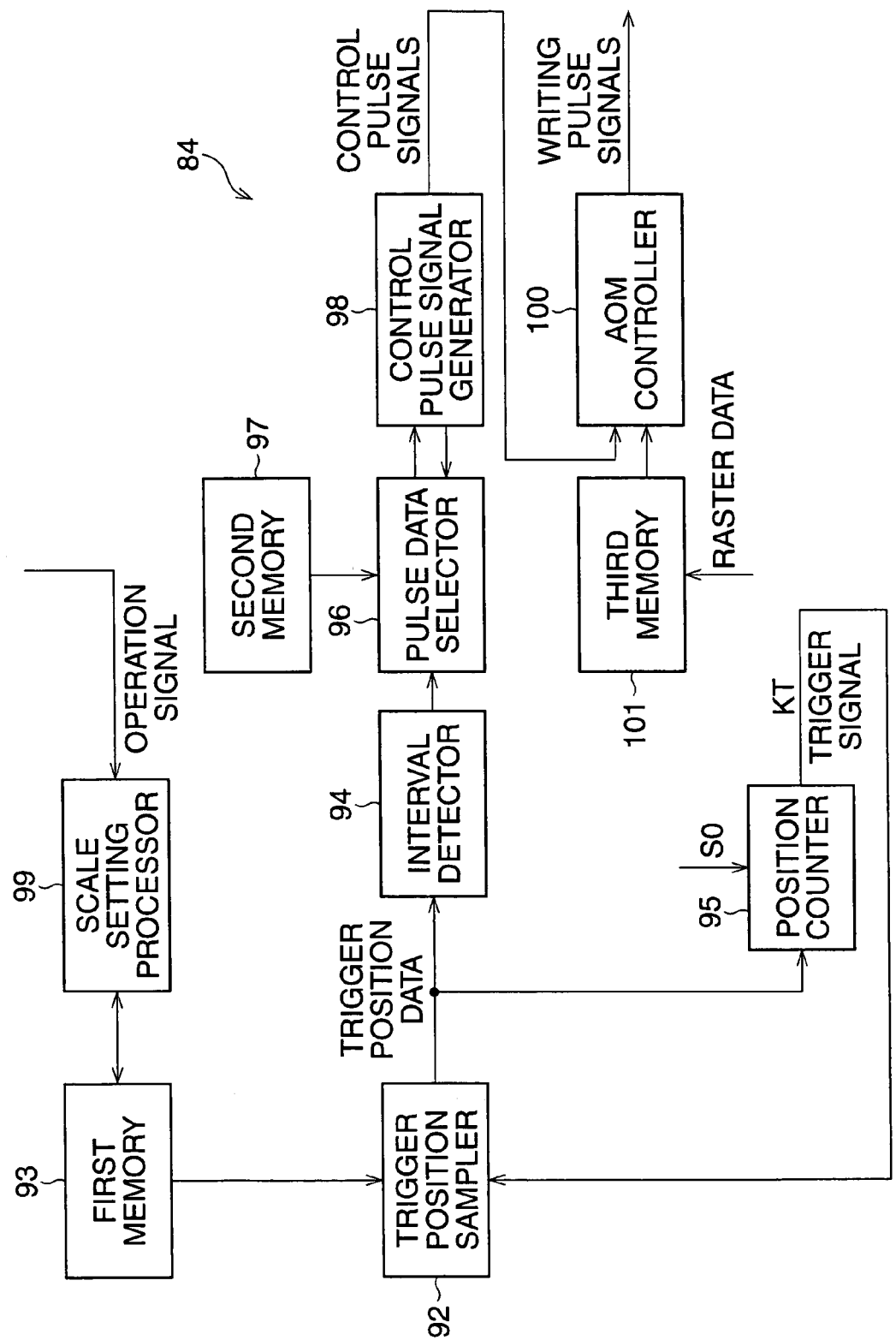
FIG. 6 is a block diagram of a writing pulse signal generator.
Figure 8:
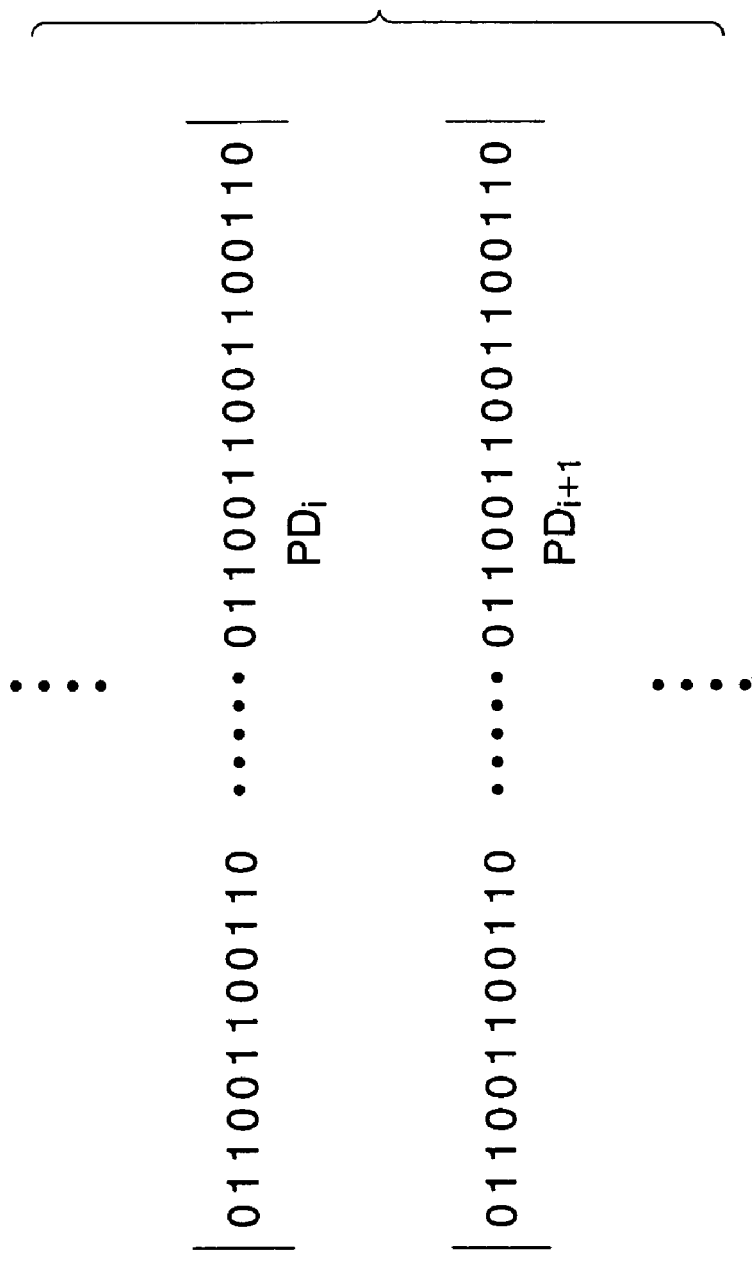
FIG. 8 is a view showing a series of sets of pulse data.
Figure 9:
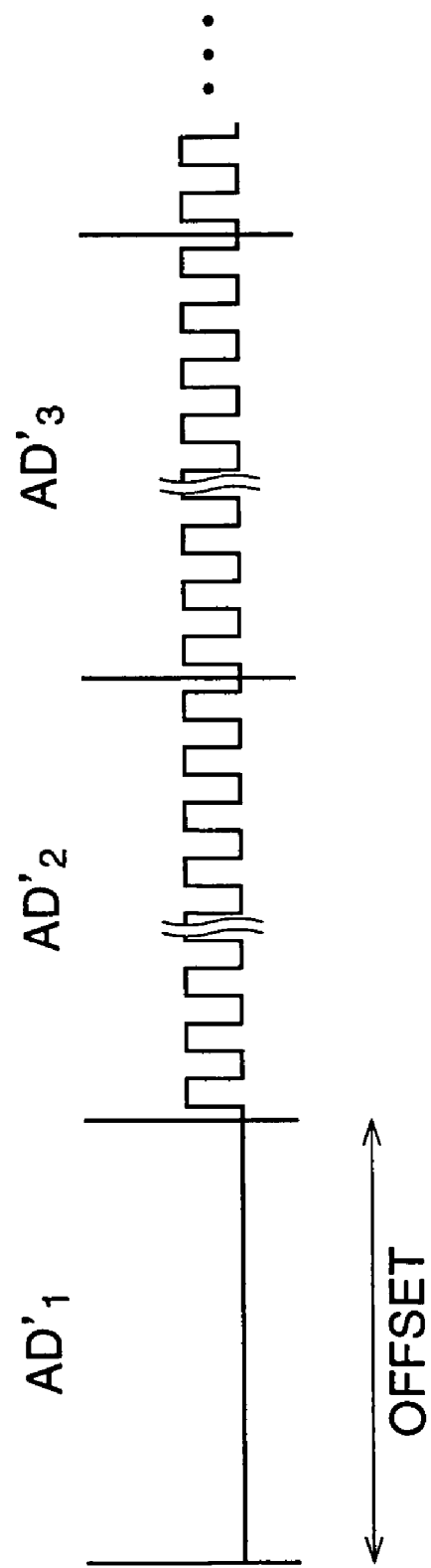
FIG. 9 is a view showing a sequence of control pulse signals.

FIG. 6 is a block diagram of the writing pulse signal generator 84, and FIG. 7 is a view showing the trigger position data. FIG. 8 is a view showing a series of sets of pulse data, and FIG. 9 is a view showing the sequence of control pulse signals.

The writing pulse signal generator 84 has a trigger position sampler 92, a first memory 93, an interval detector 94, a position counter 95, a pulse data selector 96, a second memory 97, a control pulse signal generator 98, a scale setting processor 99, an AOM controller 100, and a third memory 101. The first memory 93 is connected to the trigger position sampler 92, the second memory 97 is connected to the pulse data selector 96, and the third memory 101 is connected to the AOM controller 100.

The position of the laser beam LB for each scanning-line is detected by cumulatively counting a time from a scanning start. The scanning-time for the scanning-line is measured by using a sequence of clock pulse signals "S0" with a high frequency, higher than a frequency necessary for counting a scanning-time corresponding to one dot-pitch (hereinafter, called "a sequence of standard clock pulse signals"). When the writing process is started, the position of the laser beam LB is detected by counting the number of pulses of the sequence of standard clock pulse signals "S0". The frequency is determined such that a scanning-time that the beam LB takes to pass each fine section "$AD_j$" or corrected fine section "$AD'_j$" is counted by using a sufficiently large pulse number.

For example, when the fine section "$AD_j$" is 100 μm and the time-interval "$T_j$", which is obtained according to a predetermined scanning-speed, is 1 μs ($1 \times 10^{-6}$ s), the frequency of the sequence of standard clock pulses "S0" is set at 200 MHz. In this case, the cycle of standard clock pulse signals "CS" is 5 ns ($5 \times 10^{-9}$ s), and the counted pulse number is 200. Note that, the dot-pitch of the pattern is set at 10 μm in the accordance with the above length of the fine section "$AD_j$" (100 μm). The pass-time for a beam to pass through the interval of the dot-pitch is 100 ns ($100 \times 10^{-9}$ s).

The scanning-speed varies with the position of the laser beam LB due to the precision of the polygon mirror 36 and the f–θ lens. Therefore, the time-interval that is a pass-time of the beam LB, varies with each fine section "$AD_j$". In this embodiment, the scanning-time in each fine section "$AD_j$" is measured in advance by using the standard scale 24 and by counting the number of pulses of the sequence of standard clock pulse signals "S0". The monitor beam MB is scanned several times before pattering, and an average pulse number "K0" is calculated in each fine section by averaging a plurality of counted pulse numbers.

The series of calculated average pulse numbers are accumulated in order, and the accumulated pulse number from the scanning-start is stored in the first memory 93 as a "standard pulse number TP". For example, when the average pulse number of the fine section "$AD_1$" is 200 and the average pulse number of the fine section "$AD_2$" is 201, two standard pulse numbers "200" and "401" are stored in the first memory 93 (See FIG. 7). The series of standard pulse numbers indicates "trigger position data", which indicates a writing start position in each fine section.

When the scale of the pattern is not changed (N=1), the scanning-time corresponding to the length of each fine section "$AD_j$" is measured on the basis of the standard pulse numbers "TP" stored in the first memory 93. On the other hand, when the keyboard 82 is operated to scale down the pattern-area, the scale setting processor 99 corrects the series of trigger positions, namely, the series of standard pulse numbers TP in accordance with the scale-down rate, which is set by the operator. Consequently, a series of corrected pulse numbers "TP'" is calculated by multiplying the scale-down rate (herein, N=0.75) by the series of standard pulse numbers "TP", and is stored in the first memory 93 (See FIG. 7).

When the leaser beam LB is illuminated on a scanning-start point in the scanning-line LL after the scaling-down, the trigger position data, namely, the corrected pulse number "TP'" corresponding to the first corrected fine section "$AD'_1$" (for example, 150) is sampled from the first memory 93 by the trigger position sampler 92. The sampled corrected pulse number "TP'" is output to the position counter 95 and the interval detector 94. The sequence of standard clock pulse signals "S0" is input to the position counter 95, and the pulse-number of the sequence of standard clock pulse signals "S0" is counted. While counting, the corrected pulse number "TP'" is compared to the counted pulse number.

When the number of counted pulses coincides with the corrected pulse number "TP'", a trigger signal "KT" indicating the coincidence is fed to the trigger position sampler 92. The trigger position sampler 92 selects the next corrected pulse number "TP'" corresponding to the corrected fine section "$AD'_2$" (for example, 300), and outputs it to the interval detector 94 and the position counter 95. The position counter 95 outputs the trigger signal "KT" every time the number of counted pulses coincides with the corrected pulse number "TP'". The corrected pulse number is input to the position counter 95 and the interval detector 94 one after another.

In the interval detector 94, a difference between a previous corrected pulse number "$TP'_{j-1}$", previously output from the trigger position sampler 92, and a current corrected pulse number "$TP'_j$", currently output from the trigger position sampler 92, is calculated as a "pulse difference". The scanning-time, namely, the length of the corrected fine section "$AD_j$" is measured from the pulse difference number "$DT_j$" (=$TP'_j - TP'_{j-1}$). For example, when the previous corrected pulse number "$TP'_1$" is "150", and the current corrected pulse number "$TP'_2$" is "300", the pulse difference number "$DT_j$" is "150". The pulse difference number "$DT_j$" is output from the interval detector 94 to the pulse data selector 96.

In the second memory 97, a series of sets of pulse data "$PD_i$" (i=1, 2, . . . ) is stored in advance (See FIG. 8). Each set of pulse data "$PD_i$" has data that is composed of "0" and "1" and is periodically arranged, and defines a timing for turning the AOM 28 ON/OFF. The series of sets of pulse data "$PD_i$" corresponds to a plurality of pulse difference numbers "DT", which vary with the scale-down rate "N". The series of sets of pulse data "$PD_i$" covers a range from small pulse difference numbers to large pulse difference numbers. Namely, the series of sets of pulse data "$PD_i$" corresponds to the series of standard fine sections "$AD_j$" and the series various corrected fine sections "$AD'_j$". The pulse data selector 96 selects a set of pulse data corresponding to the pulse difference number "DT" from the series of sets of pulse data "$PD_i$". The selected set of pulse data is read from the second memory 97 and is output to the control pulse signal generator 98.

In the control pulse signal generator 98, a sequence of control pulse signals "$PF_j$" (j=1, 2, . . . ) is successively generated on the basis of the standard clock pulse signals "S0" for each fine section "$AD_j$" or corrected fine section "$AD'_j$". The sequence of control pulse signals "$PF_j$" controls an output-timing of the sequence of writing pulse signals. After a sequence of control pulse signals corresponding to one fine section is generated, the control pulse signal generator 98 feeds a reset signal, which requires a next set of pulse data, to the pulse data selector 96. The pulse data selector 96 feeds the next selected set of pulse data to the control pulse signal generator 98.

The frequency of the sequence of control pulse signals "$PF_j$" corresponds to the length of the corresponding fine section "$AD_j$" or corrected fine section "$AD'_j$". The frequency of the sequence of control pulse signals "$PF_j$" is defined on the basis of the data-array of the corresponding set of pulse data. For example, the frequency determined by the sequence of control pulse signals "$PF_j$" corresponding to a small scale-down rate "N", which is close to "1" (For example, N=0.9) is lower than that of the sequence of control pulse signals "$PF_j$" corresponding to the relatively large scale-down rate (For example, N=0.6).

Note that, the first fine section "$AD_1$" or corrected first fine section "$AD'_1$" is an offset-section. Actually, the writing process is started from the second fine section "$AD_2$" or corrected second fine section "$AD'_2$". The AOM 28 is controlled so as to be OFF so that the laser beam LB is not directed to the substrate 20.

Raster data, which corresponds to a circuit-pattern and is fed from a computer system (not shown), is temporarily stored in the third memory 101. Then, the raster data is output from the third memory 101 to the AOM controller 100 in order. The AOM controller 100 outputs the raster data to the AOM driver 85 as the "sequence of writing pulse signals", while synchronizing the raster data with the sequence of control pulse signals "$PF_j$".

In this way, the laser writer 10 generates a sequence of control pulse signals without a PLL circuit. Further, since the series of sets of pulse data is stored in the first memory 95 in advance, various control pulse signals can be generated in accordance with an optional scale-down rate.

The position of the beam LB may be detected by detecting a rotation-position of the polygon mirror 36 instead of using the standard scale 24. Another optical modulator may be applied instead of the AOM 28. An alternate exposure optical system may be used. The length of the fine section may be optionally defined such that the length is longer than the dot-pitch, or dot-interval.

The pattern may by scaled-up in addition to scaled-down. In this case, a series of sets of pulse data corresponding to the scale-up rate is prepared in advance.

A laser scanner using a photoreceptor may be applied instead of the laser writer using the substrate.

Finally, it will be understood by those skilled in the art that the foregoing description is of preferred embodiments of the device, and that various changes and modifications may be made to the present invention without departing from the spirit and scope thereof.

The present disclosure relates to subject matters contained in Japanese Patent Application No. 2003-129893 (filed on May 8, 2003), which is expressly incorporated herein, by reference, in its entirety.

What is claimed is:

1. An apparatus for forming a pattern comprising:
   a light source that emits a beam;
   a scanning unit that scans the beam on a photosensitive material;
   a beam position detector that measures a position of the beam on a scanning-line;
   a fine-section scale corrector that changes the scale of a series of fine-sections to a series of corrected fine-sections in accordance with a scale-change rate to change a scale of a pattern, the series of fine sections being defined by dividing a scanning-line at constant-intervals;
   a pulse data selector that selects a set of pulse data, corresponding to a length of the corrected fine section that the beam passes, from a series of sets of pulse data, the series of sets of pulse data having a different data-array in accordance with the length of the corrected fine section;
   a control pulse signal generator that successively generates a sequence of control pulse signals in accordance with the selected set of pulse data;
   a writing pulse signal generator that successively generates a sequence of writing pulse signals in accordance with the sequence of control pulse signals, the sequence of control pulse signals controlling the output-timing of the sequence of writing pulse signals; and
   an optical modulator that modulates the beam in accordance with the sequence of writing pulse signals.

2. The apparatus of claim 1, wherein said position detector detects the position of the beam by counting a pulse number of a sequence of standard clock pulse signals with a given frequency that is higher than a frequency necessary for counting a scanning-time corresponding to a dot-pitch.

3. The apparatus of claim 1, wherein said fine-section scale corrector sets a writing start position for each fine section as a trigger position, and changes the trigger position to a corrected trigger position in accordance with the scale-change rate, said position detector successively detecting the position of the beam from adjacent corrected trigger positions.

4. The apparatus of claim 1, wherein said fine-section scale corrector scales down the series of fine sections.

5. The apparatus of claim 1, wherein said optical modulator comprises an AOM (Acousto-Optical Modulator).

6. The apparatus of claim 1, wherein said scanning unit comprises a polygon mirror and an f–θ lens.

7. An apparatus for generating a sequence of control pulse signals comprising:
   a beam position detector that measures a position of the beam on a scanning-line;
   a fine-section scale corrector that changes a scale of a series of fine-sections to a series of corrected fine-sections in accordance with a scale-change rate, to change a scale of a pattern, the series of fine sections being defined by dividing a scanning-line at constant-intervals;
   a pulse data selector that selects a set of pulse data, corresponding to a length of the corrected fine section that the beam passes, from a series of sets of pulse data, the series of sets of pulse data having a different data-array in accordance with the length of the corrected fine section; and
   a control pulse signal generator that successively generates a sequence of control pulse signals in accordance with the selected set of pulse data.

8. A method for generating a sequence of control pulse signals comprising:
   measuring a position of the beam on a scanning-line;
   changing a scale of a series of fine-sections to a series of corrected fine-sections in accordance with a scale-change rate, to change a scale of a pattern, the series of fine sections being defined by dividing a scanning-line at constant-intervals;
   selecting a set of pulse data, corresponding to a length of the corrected fine section that the beam passes, from a series of sets of pulse data, the series of sets of pulse data having a different data-array in accordance with the length of the corrected fine section; and
   successively generating a sequence of control pulse signals in accordance with the selected set of pulse data.

* * * * *